(12) United States Patent
Du et al.

(10) Patent No.: US 10,871,533 B2
(45) Date of Patent: Dec. 22, 2020

(54) POWER SUPPLY APPARATUS AND MAGNETIC RESONANCE IMAGING SYSTEM

(71) Applicant: Siemens Shenzhen Magnetic Resonance Ltd., Shenzhen (CN)

(72) Inventors: Shu Du, Shenzhen (CN); Wen Ming Li, Shenzhen (CN); JianMin Wang, Shenzhen (CN); Tong Tong, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/427,692

(22) Filed: May 31, 2019

(65) Prior Publication Data
US 2019/0369177 A1   Dec. 5, 2019

(30) Foreign Application Priority Data

May 31, 2018   (CN) .......................... 2018 1 0547523

(51) Int. Cl.
   *G01R 33/36*   (2006.01)
   *H03K 5/24*   (2006.01)

(52) U.S. Cl.
   CPC .......... *G01R 33/3614* (2013.01); *H03K 5/24* (2013.01)

(58) Field of Classification Search
   CPC .............................. G01R 33/3614; H03K 5/24
   See application file for complete search history.

(56) References Cited

U.S. PATENT DOCUMENTS

| | | | |
|---|---|---|---|
| 2007/0057669 A1* | 3/2007 | Kobayashi | G01R 33/04 324/253 |
| 2008/0012636 A1* | 1/2008 | Lenz | G01R 33/3852 330/96 |
| 2010/0148874 A1* | 6/2010 | Thuringer | G01R 33/3614 330/279 |

* cited by examiner

*Primary Examiner* — Gregory H Curran
(74) *Attorney, Agent, or Firm* — Schiff Hardin LLP

(57) ABSTRACT

A power supply apparatus for a magnetic resonance apparatus has a power supply terminal module with a power supply unit and a reference voltage pull-down unit, and a load terminal module with a voltage comparator connected to a load power-feed terminal, which compares a nominal voltage and an actual voltage of the load power-feed terminal. A counter begins counting when the actual voltage is lower than the nominal voltage, and keeps its count unchanged when the actual voltage is equal to the nominal voltage, and emits a signal corresponding to the count to a digital-to-analog converter, connected to a phase inverter, which converts the digital signal to a positive analog voltage. A phase inverter is connected to an output voltage reference terminal of the power supply unit, and inverts the phase of the analog voltage to produce a negative analog voltage that compensates voltage drop loss on a cable between the power supply and the load power-feed terminal.

10 Claims, 2 Drawing Sheets

POWER SUPPLY APPARATUS AND MAGNETIC RESONANCE IMAGING SYSTEM

BACKGROUND OF THE INVENTION

Field of the Invention

The present invention relates to the technical field of magnetic resonance, in particular to a power supply apparatus and a magnetic resonance imaging system embodying such a power supply.

Description of the Prior Art

In a magnetic resonance imaging (MRI) system, there will generally be special power supply unit modules that supply power to various components in the system, such as a preamplifier (abbreviated LNA) of an RF receiving coil. In general, the power supply unit modules are distributed in a cabinet outside the magnetic resonance examination room, or are distributed at a side of the scanner between devices, or in other positions. Regardless of the type of distribution, there will be a relatively long length of cable between the LNA and the power supply unit module that supplies power to the LNA. When the RF coil is operating normally, the total current of the LNA of a multi-channel reception coil cannot be ignored. Due to cable loss, the total current of the LNA will experience a voltage drop along the cable, with the result that the LNA power-feed voltage is unable to attain the nominal voltage of the device, and in turn the performance of the LNA will be affected, e.g. the noise factor of the LNA will deteriorate.

SUMMARY OF THE INVENTION

In view of the above, an object of the present invention is to provide a power supply apparatus and an MRI system that is able to compensate for a voltage drop loss on a cable between a power supply unit and a load power-feed terminal, to ensure the normal operation of the load.

In a first aspect, the present invention provides a power supply apparatus, having a power supply unit, connected to a load power-feed terminal, used for supplying power to a load, and a voltage comparator, having an input terminal connected to the load power-feed terminal, used for comparing a nominal voltage and an actual voltage of the load power-feed terminal. The power supply apparatus according to the invention further has a reference voltage pull-down unit, which includes a counter, a digital-to-analog converter, and a phase inverter. When the voltage comparator determines that the actual voltage is lower than the nominal voltage, the counter performs counting, and the digital-to-analog converter converts a digital signal, obtained by the counter and indicating a counting result, to a corresponding analog voltage. The phase inverter inverts the phase of this analog voltage, and the phase-inverted analog voltage is supplied to a reference terminal of the power supply unit.

In an embodiment, a negative input terminal of the voltage comparator is connected to the load power-feed terminal, and the nominal voltage is provided as an input to a positive input terminal of the voltage comparator, which compares voltages of the positive input terminal and negative input terminal thereof, so as to emit an output at a first level when the voltage of the negative input terminal thereof is lower than the voltage of the positive input terminal thereof, otherwise to emit the output at a second level.

In a further version of this embodiment, a load terminal module further has a first programmable logic controller, having an input terminal connected to an output terminal of the voltage comparator, and having an output terminal connected to the reference voltage pull-down unit. The load end module emits a first signal as an output thereof upon receiving the output of the components at the first level, the first signal controlling the counter so as to perform counting. The load end module emits as its output a second signal upon receiving the output from the comparator at the second level. The second signal controls the counter to keep the counting result unchanged.

In a further version of this embodiment, the first signal includes a trigger signal and a first control signal, and the second signal includes a second control signal. The first programmable logic controller has a first output terminal at which the trigger signal is emitted, and a second output terminal at which the first control signal and the second control signal are emitted. The first output terminal is connected to an input terminal of the counter. The reference voltage pull-down unit further has a second programmable logic controller, having a first input terminal connected to the second output terminal, and having an output terminal connected to an ENABLE terminal of the counter and to an ENABLE terminal of the digital-to-analog converter. The ENABLE terminal of the counter and the ENABLE terminal of the digital-to-analog converter to be in an enabled state upon receiving the first control signal, and the ENABLE terminal of the counter and the ENABLE terminal of the digital-to-analog converter are put in a locked state upon receiving the second control signal.

In a further version of this embodiment, the first programmable logic controller further has a third output terminal for at which a synchronization is emitted as an output signal, and the second programmable logic controller further has a second input terminal connected to the third output terminal.

In an embodiment, the digital-to-analog converter performs the digital-to-analog conversion according to a first formula:

$$V_o = 0.01 X (D_0 + 2D_1 + 4D_2 + \ldots + 2^{(n-1)} D_{n-1})$$

wherein $_0\text{-}D_{n-1}$ are digital signals emitted as outputs by the counter, $V_o$ is a positive analog voltage emitted as an output by the digital-to-analog converter, and n is the number of input terminals of the digital-to-analog converter.

In an embodiment, the phase inverter includes an operational amplifier, a feedback resistor and a grounding resistor. A positive input terminal of the operational amplifier is connected to a grounding terminal via the grounding resistor, a negative input terminal of the operational amplifier is connected to the output terminal of the digital-to-analog converter, the feedback resistor is connected between the negative input terminal and an output terminal of the operational amplifier, and the output terminal of the operational amplifier is coupled to the output voltage reference terminal.

In a further version of this embodiment, a first resistor is connected between the output voltage reference terminal of the power supply unit and an output terminal of the power supply unit, and the phase inverter further has a second resistor and/or a third resistor. The second resistor, if present, is disposed between the output voltage reference terminal and the output terminal of the operational amplifier. The third resistor, if present, is disposed between the negative input terminal of the operational amplifier and the output terminal of the digital-to-analog converter.

The load power-feed terminal can serve a power supply input terminal for a preamplifier in a magnetic resonance imaging system.

In a second aspect of the present invention, a magnetic resonance imaging system has a preamplifier and a power supply apparatus that supplies power to the preamplifier, wherein the power supply apparatus is as described above.

In summary, when the voltage of the load power-feed terminal is lower than the nominal voltage thereof, the load terminal module will output a trigger signal and a first control signal to the reference voltage pull-down unit. Upon receiving the trigger signal and the first control signal, the reference voltage pull-down unit will emit a gradually decreasing negative voltage as an output, thereby causing the reference terminal voltage to gradually decrease, and in turn causing the voltage of the load power-feed terminal to gradually rise, thereby compensating for a voltage drop loss on a cable between the power supply apparatus and the load power-feed terminal. This avoids a situation where the voltage of the load power-feed terminal is unable to attain the nominal voltage, and in turn ensures normal operation of the load.

DESCRIPTION OF THE PREFERRED EMBODIMENTS

Figure 1:
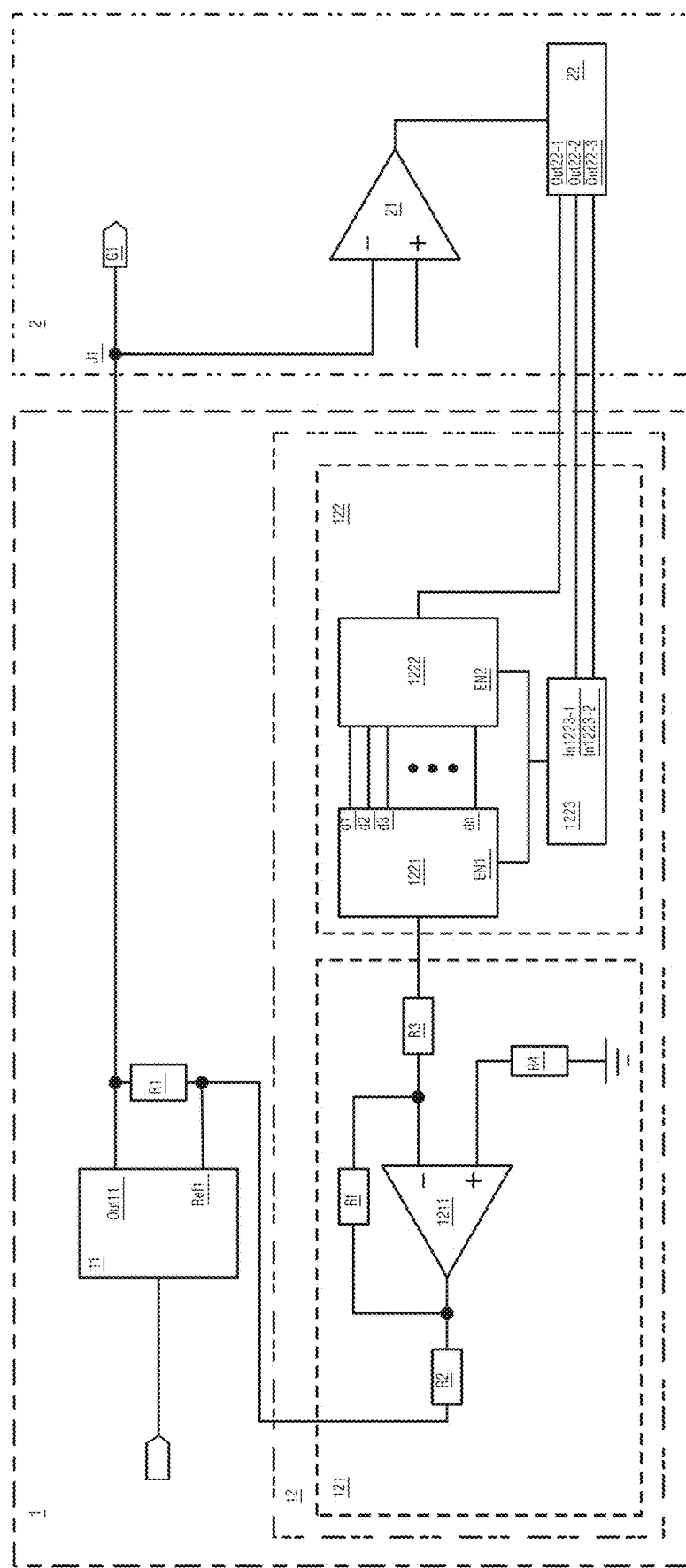
FIG. 1 is a block circuit diagram of a power supply apparatus in an embodiment of the present invention.

As used herein, "schematic" means "serving as an instance, example or illustration". Unless specifically stated as such, no drawing or embodiment described herein as "schematic" should be interpreted as a more preferred or more advantageous technical solution.

To make the drawings appear uncluttered, only those parts relevant to the present invention are shown schematically in the drawings; they do not represent the actual structure thereof as a product. Furthermore, to make the drawings appear uncluttered for ease of understanding, in the case of components having the same structure or function in certain drawings, only one of these is drawn schematically, or only one is marked.

The present invention provides a power supply apparatus, which may also be called a power supply unit processing apparatus; the apparatus may be used to supply power to various components in an MRI system, such as a preamplifier (abbreviated as LNA) in a coil, and of course may also be used to supply power in other fields or systems.

As shown in FIG. 1, the apparatus has a power supply terminal module 1 and a load terminal module 2. The power supply terminal module 1 has a power supply unit and a reference voltage pull-down unit 12. The reference voltage pull-down unit 12 includes a counter 1222, a digital-to-analog converter 1221 and a phase inverter, formed as a phase inverting sub-unit 121. The counter 1222 and the digital-to-analog converter 1221 form a voltage generating sub-unit 122. The load terminal module 2 comprises a voltage comparator 21 with an input terminal connected to a load power-feed terminal G1. The voltage comparator 21 compares a nominal voltage and an actual voltage of the load power-feed terminal G1.

The counter 1222 has output terminals connected to input terminals $d_1$-$d_n$ of the digital-to-analog converter 1221 in a one-to-one manner, and starts counting when the actual voltage is lower than the nominal voltage, and keeps the counting result unchanged when the actual voltage is equal to the nominal voltage. The counter 1222 emits a digital signal corresponding to the counting result as an output.

The digital-to-analog converter 1221 has an output terminal connected to an input terminal of the phase inverter, and converts the digital signal to a corresponding positive analog voltage. The larger the digital signal is, the larger the positive analog voltage is.

The phase inverter 121 has an output terminal connected to an output voltage reference terminal Ref1 of the power supply unit, and inverts the phase of the analog voltage so as to produce a negative analog voltage.

The power supply unit has an output terminal connected to the load power-feed terminal G1, and supplies power to a load. The power supply unit may be a DC-DC converter 11. In that case, the output terminal of the power supply unit is an output terminal Out11 of the DC-DC converter 11, and the output voltage reference terminal of the power supply unit is the output voltage reference terminal Ref1 of the DC-DC converter 11.

The DC-DC converter 11 converts a DC voltage received by its own input terminal, i.e., a received high voltage, to a usable low voltage, and then emits the low voltage via its own output terminal. Ordinarily, the output voltage reference terminal Ref1 of the output voltage of the DC-DC converter 11 is grounded, i.e. a reference voltage is 0, but in the present application the output voltage reference terminal Ref1 is connected to the reference voltage pull-down unit 12. When the actual voltage of the load power-feed terminal G1 is lower than the nominal voltage, the reference voltage pull-down unit 12 emits a negative analog voltage, which gradually decreases, therefore the voltage of the output voltage reference terminal Ref1 is a negative value and gradually decreases, so that the voltage value of the load power-feed terminal G1 will gradually be pulled up. When the actual voltage of the load power-feed terminal is equal to the nominal voltage, the reference voltage pull-down unit 12 can keep the emitted negative analog voltage unchanged, thus keeping the voltage of an output voltage load terminal unchanged, thereby keeping the voltage of the load power-feed terminal G1 at a high voltage value.

It will be understood that if a reference voltage apparatus or port is not specially mentioned, the reference voltage thereof is 0, e.g. the reference voltage of the load power-feed terminal G1 is 0. Since the output terminal Out11 of the DC-DC converter 11 and the load power-feed terminal G1 are connected to an actual voltage input terminal of the voltage comparator 21, a connection point can be marked as a first node J1. Since the load power-feed terminal G1 (having a reference voltage of 0) is connected to the first node J1, the voltage of the load power-feed terminal G1 is the voltage of the first node J1. At the same time, since the first node J1 is connected to the output terminal of the DC-DC converter 11, the voltage of the first node J1 is the voltage of the output terminal of the DC-DC converter 11 relative to the output voltage reference terminal Ref1 thereof, i.e. the voltage of the load power-feed terminal G1 is the voltage of the output terminal of the DC-DC converter 11 relative to the output voltage reference terminal Ref1 thereof.

The basic operating principles of the power supply apparatus are briefly as follows.

When the voltage comparator 21 in the load power-feed terminal G1 compares the nominal voltage and the actual voltage of the load power-feed terminal G1, and the reference voltage pull-down unit 12 is then informed that the actual voltage is lower than the nominal voltage, the counter 1222 therein will begin counting, so as to generate a digital signal. The digital-to-analog converter 1221 will convert the digital signal to a negative analog voltage, and the phase inverter 121 inverts this negative analog voltage so as to produce a positive analog voltage. Since the higher the count is, the larger the digital signal is, the larger the positive analog voltage is, and the smaller the negative analog voltage is. Also, since the output terminal of the phase inverter 121 is connected to the output terminal of the power supply unit, the smaller the reference voltage of the power supply unit is, so that the voltage of the load power-feed terminal G1 gradually increases. When the actual voltage of the load power-feed terminal G1 increases to the nominal voltage, the counter 1222 stops counting, therefore the digital signal stays unchanged. Therefore, the positive analog voltage obtained by the digital-to-analog converter 1221 does not change, and the negative analog voltage obtained by the phase inverter 121 stays unchanged, hence the reference voltage of the output voltage reference terminal Ref1 stays unchanged, thereby keeping the voltage of the load power-feed terminal G1 at the nominal voltage.

In the power supply apparatus according to the present invention, the voltage comparator 21 compares the nominal voltage and the actual voltage of the load power-feed terminal G1. When the actual voltage is lower than the nominal voltage, the counter 1222 begins counting, generating a digital signal; the digital-to-analog converter 1221 converts the digital signal to a positive analog voltage, and the phase inverter 121 inverts the phase of the positive analog voltage to give a negative analog voltage, thereby reducing the reference voltage of the output voltage reference terminal, and in turn raising the voltage of the load power-feed terminal G1. When the actual voltage is equal to the nominal voltage, the results of the counter 1222, the digital-to-analog converter 1221 and the phase inverter 121 all stay unchanged, therefore the voltage of the load power-feed terminal G1 stays at the nominal voltage. Clearly, the present invention can compensate for a voltage drop loss on a cable between the power supply unit and the load power-feed terminal G1, avoiding a situation where the voltage of the load power-feed terminal G1 is unable to attain the nominal voltage, and in turn ensuring normal operation of the load.

In some embodiments, a negative input terminal of the voltage comparator 21 is connected to the load power-feed terminal G1, and the nominal voltage is provided to a positive input terminal of the voltage comparator, which compares the voltages of the positive input terminal and negative input terminal thereof, and emits an output at a first level when the voltage of the negative input terminal thereof is lower than the voltage of the positive input terminal thereof, otherwise it emits the output at a second level. For example, the actual voltage value of the load power-feed terminal G1 received by the negative input terminal is compared, by voltage comparator 21, with the nominal voltage value received by the positive input terminal. When the actual voltage value is lower than the nominal voltage value, the voltage comparator 21 will emit its output at the first level (e.g. 1), and when the actual voltage value is equal to the normal voltage value, the voltage comparator 21 will emit the output at the second level (e.g. 0).

In some embodiments, the load terminal module 2 further has a first programmable logic controller 22, having an input terminal connected to an output terminal of the voltage comparator 21, and having an output terminal connected to the reference voltage pull-down unit 12. The logic controller 22 emits a first signal upon receiving the comparator output at the first level, the first signal controlling the counter 1222 so as to perform counting. The logic controller 22 emits a second signal upon receiving the comparator output at the second level. The second signal controls the counter 1222 so as to keep the counting result thereof unchanged.

The logic in the first programmable logic controller 22 can be set by programming in advance, such that it emits the first signal upon receiving the first level and emits the second signal upon receiving the second level. Here, the load terminal module 2 includes the voltage comparator 21 and the first programmable logic controller 22; since the logic in the first programmable logic controller 22 can be set by programming in advance, the number of devices can be reduced, simplifying the circuitry.

The first signal may include a trigger signal and a first control signal, and the second signal may include a second control signal. The trigger signal triggers the counter 1222 so as to perform counting. The first control signal controls ENABLE terminals of the counter 1222 and the digital-to-analog converter 1221 so as to be in an enabled state, and the second control signal controls (sets) the ENABLE terminals of the counter 1222 and the digital-to-analog converter 1221 so as to be in a disabled state.

Correspondingly, the first programmable logic controller 22 has a first output terminal Out22-1 for emitting the trigger signal, and a second output terminal Out22-2 for emitting the first control signal and the second control signal. The first output terminal Out22-1 is connected to an input terminal of the counter 1222. The first output terminal Out22-1 of the first programmable logic controller 22 emits the trigger signal, and the second output terminal Out22-2 emits the first control signal and the second control signal.

The reference voltage pull-down unit 12 further has a second programmable logic controller 1223. The second programmable logic controller 1223 has a first input terminal In1223-1 connected to the second output terminal Out22-2, and has an output terminal connected to an ENABLE terminal EN2 of the counter and to an ENABLE terminal EN1 of the digital-to-analog converter. The second programmable logic controller 1233 causes the ENABLE terminal EN2 of the counter 1222 and the ENABLE terminal EN1 of the digital-to-analog converter 1221 to be in an enabled state upon receiving the first control signal, and to cause the ENABLE terminal EN2 of the counter 1222 and the ENABLE terminal EN1 of the digital-to-analog converter 1221 to be in a locked state upon receiving the second control signal.

The counter 1222 can perform counting only when the ENABLE terminal EN2 of the counter 1222 is in an enabled state, and stops counting when in a disabled state, with the counting result staying unchanged. Digital-to-analog conversion can be performed only when the ENABLE terminal EN1 of the digital-to-analog converter 1221 is in an enabled state; when it is in a disabled state, the digital-to-analog conversion stops.

The counter 1222, the second programmable logic controller 1223 and the digital-to-analog converter 1221 form the voltage generating sub-unit 122, while the phase inverter forms the phase inverting sub-unit 121. The voltage generating sub-unit 122 and the phase inverting sub-unit 121 are connected in sequence to form the reference voltage pull-down unit 12, wherein the voltage generating sub-unit 122 is responsible for generating a gradually increasing positive voltage, and the phase inverting sub-unit 121 is responsible for inverting the gradually increasing positive voltage, so as to obtain a gradually decreasing negative voltage.

The counter 1222 may be a 4-bit counter, and can have 16 counting results within one counting cycle. The digital-toanalog converter 1221 can generate 16 positive analog voltages on the basis of these 16 counting results. When the counter 1222 is a 4-bit counter, the number of output terminals thereof may be 4, but may also be more than 4; since the input terminals $d_1$-$d_n$ of the digital-to-analog converter 1221 are connected to the output terminals of the counter 1222 in a one-to-one manner, the number of input terminals of the digital-to-analog converter 1221 may be 4, but may also be more than 4, e.g. 8.

The digital-to-analog converter 1221 may perform digital-to-analog conversion according to $$V_o = 0.01 X (D_0 + 2D_1 + 4D_2 + \ldots + 2^{(n-1)} D_{n-1})$$

wherein $D_0$-$D_{n-1}$ are digital signals emitted by the counter 1222, $V_o$ is an analog voltage emitted by the digital-to-analog converter 1221, and n is the number of input terminals of the digital-to-analog converter 1221.

For example, when the counting result is 0001, a digital-to-analog conversion result is 0.16 and, when the counting result is 0010, the digital-to-analog conversion result is 0.32; clearly, the higher the count is, the larger the analog voltage obtained by digital-to-analog conversion.

The first programmable logic controller 22 can further have a third output terminal Out22-3 for emitting a synchronization signal, and the second programmable logic controller 1223 can further have a second input terminal In1223-2 connected to the third output terminal Out22-3. The second input terminal In1223-2 is connected to the third output terminal Out22-3. Upon receiving the first level, the first programmable logic controller 22 also transmits a synchronization signal to the second programmable logic controller 1223, in order to synchronize the first programmable logic controller 22 and the second programmable logic controller 1223. Each time the load terminal module 2 sends out a trigger signal, the counter 1222 in the reference voltage pull-down unit 12 counts 1.

Here, the method of raising the voltage of the load power-feed terminal G1 until the voltage of the load power-feed terminal G1 attains the nominal voltage by program control facilitates integration with other digital function modules, avoiding complex analog feedback circuitry, and is easy to implement; moreover, the design of the circuitry is made more flexible by means of program control.

In some embodiments, the phase inverter 121 has an operational amplifier 1211, a feedback resistor Rf and a grounding resistor R4. A positive input terminal of the operational amplifier 1211 is connected to a grounding terminal via the grounding resistor R4. A negative input terminal of the operational amplifier 1211 is connected to the output terminal of the digital-to-analog converter 1221. The feedback resistor Rf is connected between the negative input terminal and an output terminal of the operational amplifier 1211. The output terminal of the operational amplifier 1211 is coupled to the output voltage reference terminal Ref1.

Here, the phase inverter 121 includes an op-amp 1211, the feedback resistor Rf and the grounding resistor R4. In order to further facilitate adjustment of the reference voltage, it is also possible to provide a first resistor R1, a second resistor R2 and a third resistor R3, i.e. the phase inverter 121 further comprises the first resistor R1, the second resistor R2 and/or the third resistor R3. The first resistor R1 is disposed between the output voltage reference terminal Ref1 of the power supply unit and the output terminal Out11 of the power supply unit. The second resistor R2 is disposed between the output voltage reference terminal Ref1 and the output terminal of the operational amplifier 1211. The third resistor R3 is disposed between the negative input terminal of the operational amplifier 1211 and the output terminal of the digital-to-analog converter 1221.

Based on the addition of the second resistor R2 and the third resistor R3, a relationship among an output voltage $V_o$ of the digital-to-analog converter 1221, a reference voltage $V_{Ref1}$ of the output voltage reference terminal Ref1 and a voltage $V_c$ of the load power-feed terminal G1 may be expressed as:

$$V_c = (1 + \frac{R1}{R2}) V_{Ref1} + \frac{R1}{R2} \cdot \frac{Rf}{R3} \cdot V_o$$

wherein R1 is the first resistor, R2 is the second resistor, R3 is the third resistor and Rf is the feedback resistor.

By adjusting the various resistors above, the voltage $V_c$ of the load power-feed terminal G1 and the output voltage $V_o$ of the digital-to-analog converter 1221 can be made to satisfy the relation: $V_c = 7.2 + V_o$.

Figure 2:
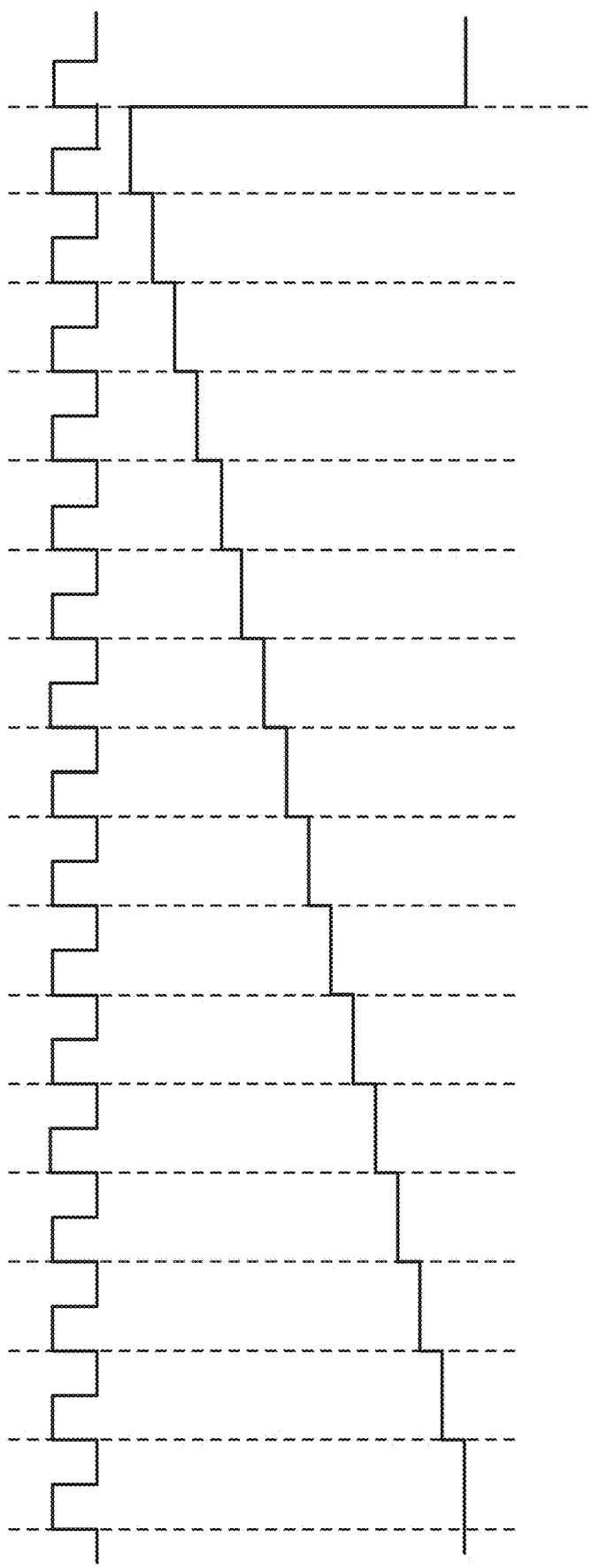
FIG. 2 is a waveform diagram of a trigger signal and a digital-to-analog converter output voltage in an embodiment of the present invention.

As shown in table 1 below, within one counting cycle, the counter 1222 counts 1 each time it receives a rising edge, i.e. a trigger signal, transmitted by the first programmable logic controller 22, i.e. a counting result increases by 1. Digital signals received by 8 input terminals of the digital-to-analog converter 1221 correspond to the counting result of the counter 1222. The digital-to-analog converter 1221 performs digital-to-analog conversion according to the received digital signals, to obtain an analog voltage. As shown in FIG. 2, as the counting result increases, the value of the analog voltage gradually increases, and for each 1 counted, the analog voltage increases by 0.16. In FIG. 2, the square wave is the trigger signal, and the stepped wave is the gradually increasing analog voltage. The voltage $V_c$ of the load power-feed terminal G1 and the output voltage $V_o$ of the digital-to-analog converter 1221 satisfy the relation: $V_c = 7.2 + V_o$, so the voltage $V_c$ of the load power-feed terminal G1, i.e. $V_{out}$ rises in steps from 7.2 V. This process can also be seen in table 1 below; the output voltage rises all the way to 9.60 V, until a sixteenth clock signal.

TABLE 1

Data correspondence table

| | Counter | | | | DAC | | | | | | | | Power Step up | | Measurement [V] |
|---|---|---|---|---|---|---|---|---|---|---|---|---|---|---|---|
| | | | | | | | | | | | | | Calculate | | |
| | Qd | Qc | Qb | Qa | d7 | d6 | d5 | d4 | d3 | d2 | d1 | d0 | Vo = 0.01 × Σ(2^n · di) [V] | Vout = 7.2 + Vo [V] | Vout |
| 1 ↑ | 0 | 0 | 0 | 0 | 0 | 0 | 0 | 0 | 0 | 0 | 0 | 0 | 0.00 | 7.20 | 7.20 |
| 2 ↑ | 0 | 0 | 0 | 1 | 0 | 0 | 0 | 1 | 0 | 0 | 0 | 0 | 0.16 | 7.36 | 7.31 |
| 3 ↑ | 0 | 0 | 1 | 0 | 0 | 0 | 1 | 0 | 0 | 0 | 0 | 0 | 0.32 | 7.52 | 7.47 |
| 4 ↑ | 0 | 0 | 1 | 1 | 0 | 0 | 1 | 1 | 0 | 0 | 0 | 0 | 0.48 | 7.68 | 7.63 |

TABLE 1-continued

Data correspondence table

|  |  | Counter | | | | DAC | | | | | | | | Power Step up | | Measurement [V] |
| --- | --- | --- | --- | --- | --- | --- | --- | --- | --- | --- | --- | --- | --- | --- | --- | --- |
|  |  | | | | | | | | | | | | | Calculate | | |
|  |  | Qd | Qc | Qb | Qa | d7 | d6 | d5 | d4 | d3 | d2 | d1 | d0 | $V_o = 0.01 \times \Sigma(2^n \cdot d_i)$ [V] | $V_{out} = 7.2 + V_o$ [V] | Vout |
| 5 | ↑ | 0 | 1 | 0 | 0 | 0 | 1 | 0 | 0 | 0 | 0 | 0 | 0 | 0.64 | 7.84 | 7.80 |
| 6 | ↑ | 0 | 1 | 0 | 1 | 0 | 1 | 0 | 1 | 0 | 0 | 0 | 0 | 0.80 | 8.00 | 7.95 |
| 7 | ↑ | 0 | 1 | 1 | 0 | 0 | 1 | 1 | 0 | 0 | 0 | 0 | 0 | 0.96 | 8.16 | 8.11 |
| 8 | ↑ | 0 | 1 | 1 | 1 | 0 | 1 | 1 | 1 | 0 | 0 | 0 | 0 | 1.12 | 8.32 | 8.26 |
| 9 | ↑ | 1 | 0 | 0 | 0 | 1 | 0 | 0 | 0 | 0 | 0 | 0 | 0 | 1.28 | 8.46 | 8.44 |
| 10 | ↑ | 1 | 0 | 0 | 1 | 1 | 0 | 0 | 1 | 0 | 0 | 0 | 0 | 1.44 | 8.64 | 8.60 |
| 11 | ↑ | 1 | 0 | 1 | 0 | 1 | 0 | 1 | 0 | 0 | 0 | 0 | 0 | 1.60 | 8.80 | 8.75 |
| 12 | ↑ | 1 | 0 | 1 | 1 | 1 | 0 | 1 | 1 | 0 | 0 | 0 | 0 | 1.76 | 8.96 | 8.91 |
| 13 | ↑ | 1 | 1 | 0 | 0 | 1 | 1 | 0 | 0 | 0 | 0 | 0 | 0 | 1.92 | 9.12 | 9.07 |
| 14 | ↑ | 1 | 1 | 0 | 1 | 1 | 1 | 0 | 1 | 0 | 0 | 0 | 0 | 2.08 | 9.28 | 9.23 |
| 15 | ↑ | 1 | 1 | 1 | 0 | 1 | 1 | 1 | 0 | 0 | 0 | 0 | 0 | 2.24 | 9.44 | 9.39 |
| 16 | ↑ | 1 | 1 | 1 | 1 | 1 | 1 | 1 | 1 | 0 | 0 | 0 | 0 | 2.40 | 9.60 | 9.54 |

Table 1 above, the last column is an actual voltage value obtained by measuring the voltage of the load power-feed terminal G1; the difference between the actual voltage value and the theoretical voltage value is very small, and can be ignored.

It will be understood that when the power supply apparatus in the present application is used in a preamplifier of an MRI system, the load power-feed terminal G1 is a power supply input terminal of the preamplifier in the MRI system.

The present invention also provides an MRI system having a preamplifier, and a power supply apparatus as described above that supplies power to the preamplifier.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A power supply apparatus comprising:
    a power supply unit having an input terminal connected to a load power-feed terminal, said power supply unit being designed to supply power to a load;
    a voltage comparator having an input terminal connected to the load power-feed terminal, said voltage comparator comparing a nominal voltage and an actual voltage of the load power-feed terminal;
    a reference voltage pull-down unit comprising a counter, a digital-to-analog converter, and a phase inverter;
    said voltage comparator being connected to said counter and, when the voltage comparator determines that the actual voltage is lower than the nominal voltage, the voltage comparator causes said counter to begin counting, and said digital-to-analog converter converts a digital signal from the counter, representing the count thereof, to a corresponding analog voltage; and
    said phase inverter inverting a phase of the analog voltage so as to produce a phase-inverted analog voltage that is supplied to an output voltage reference terminal of the power supply unit.

2. A power supply apparatus as claimed in claim 1 wherein:
    said digital-to-analog converter has an output terminal connected to an input terminal of the phase inverter, and converts said digital signal into a corresponding positive analog voltage that becomes larger as said digital signal becomes larger; and
    said phase inverter has an output terminal connected to the output voltage reference terminal of the power supply unit, and said phase inverter inverting the phase of the analog voltage to produce a negative analog voltage.

3. A power supply apparatus as claimed in claim 1 wherein:
    said voltage comparator has a negative input terminal connected to the load power-feed terminal, and a positive input terminal to which said nominal voltage is provided as an input to the voltage comparator, and wherein said voltage comparator compares respective voltages at said positive input terminal and said negative input terminal thereof, and emits a comparator output at a first level when the voltage at the negative input terminal is lower than the voltage of the positive input terminal, and otherwise emits said comparator output at a second level.

4. A power supply apparatus as claimed in claim 1 wherein said power supply unit and said reference voltage pull-down unit are situated in a power supply end module at a power supply terminal side of a magnetic resonance imaging system, and wherein said voltage comparator is situated in a load end module at a load end side of said magnetic resonance imaging system.

5. A power supply apparatus as claimed in claim 4 wherein said load end module comprises:
    a first programmable logic controller having input terminal connected to an output terminal of the voltage comparator, and having an output terminal connected to said reference voltage pull-down unit, and wherein said first programmable logic controller emits a first signal upon receiving said comparator output said first level, said first signal controlling the counter so as to perform counting, and said first programmable logic controller emitting a second signal upon receiving said comparator output at said second level, said second signal controlling said counter to keep the count thereof unchanged.

6. A power supply apparatus as claimed in claim 5 wherein said first signal comprises a trigger signal and a first control signal, and wherein said second signal comprises a second control signal, and wherein:
    said first programmable logic controller comprises a first output terminal at which said trigger signal is emitted, and a second output terminal at which said first control signal and said second control signal are emitted, said first output terminal being connected to an input terminal of said counter; and said reference pull-down unit comprises a second programmable logic controller comprising a first input terminal connected to the second output terminal thereof, and having an output terminal connected to an ENABLE terminal of the counter and to an ENABLE terminal of the digital-to-analog converter, said ENABLE terminal of said counter and said ENABLE terminal of said digital-to-analog converter being placed in an enabled state upon receiving said first control signal, and said ENABLE terminal of the counter and the ENABLE terminal of the digital-to-analog converter being placed in a locked state upon receipt of the second control signal.

7. A power supply apparatus as claimed in claim 6 wherein said first programmable logic controller comprises a third output at which a synchronization signal is emitted, and wherein said second programmable logic controller comprises a second input terminal connected to said third output terminal.

8. A power supply apparatus as claimed in claim 1 wherein said digital-to-analog converter performs the digital-to-analog conversion therein according to:

$$V_o = 0.01X(D_0 + 2D_1 + 4D_2 + \ldots + 2^{(n-1)}D_{n-1})$$

wherein $D_0$-$D_{n-1}$ are respective digital signals emitted by the counter, $V_o$ is a positive analog voltage emitted by the digital-to-analog converter, and n is a number of input terminals of the digital-to-analog converter.

9. A power supply apparatus as claimed in claim 1 wherein:

said phase inverter comprises an operational amplifier, a feedback resistor and a grounding resister; and a positive input terminal of the operational amplifier is connected to a grounding terminal via the grounding resistor, a negative input terminal of the operational amplifier is connected to the output terminal of the digital-to-analog converter, the feedback resister is connected between the negative input terminal and the output terminal of the operational amplifier, and the output of the operational amplifier is coupled to the output voltage reference terminal.

10. A power supply apparatus as claimed in claim 9 comprising a first resistor connected between the output reference voltage terminal of the power supply unit and an output terminal of the power supply unit, and wherein said phase inverter comprises at least one of a second resistor or a third resistor, said second resistor being disposed between the output voltage reference terminal and the output terminal of the operational amplifier, the third resistor being disposed between the negative input terminal of the operational amplifier and the output terminal of the digital-to-analog converter.

* * * * *